(12) United States Patent
Peng et al.

(10) Patent No.: US 10,164,071 B2
(45) Date of Patent: Dec. 25, 2018

(54) FINFET DEVICE AND FABRICATING METHOD THEREOF

(71) Applicant: Taiwan Semiconductor Manufacturing Company, Ltd., Hsinchu (TW)

(72) Inventors: Yen-Ming Peng, Zhongli (TW); Chi-Wen Liu, Hsinchu (TW); Hsin-Chieh Huang, Hsinchu (TW); Yi-Ju Hsu, Zhudong Township (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/050,217

(22) Filed: Jul. 31, 2018

(65) Prior Publication Data

US 2018/0337267 A1   Nov. 22, 2018

Related U.S. Application Data

(62) Division of application No. 14/994,057, filed on Jan. 12, 2016.

(60) Provisional application No. 62/214,800, filed on Sep. 4, 2015.

(51) Int. Cl.
*H01L 21/70* (2006.01)
*H01L 29/66* (2006.01)
*H01L 29/78* (2006.01)

(52) U.S. Cl.
CPC ...... *H01L 29/66795* (2013.01); *H01L 29/785* (2013.01); *H01L 29/7848* (2013.01)

(58) Field of Classification Search
CPC ............. H01L 21/28088; H01L 29/401; H01L 29/4966; H01L 29/66795; H01L 29/7848; H01L 29/785
USPC .................................. 438/149, 592; 257/407
See application file for complete search history.

(56) References Cited

U.S. PATENT DOCUMENTS

| | | |
|---|---|---|
| 4,574,208 A | 3/1986 | Lade et al. |
| 5,760,536 A | 6/1998 | Susukida et al. |
| 8,969,878 B2 | 3/2015 | Kim |
| 9,076,823 B2 * | 7/2015 | Lin ................... H01L 29/66795 |
| 9,093,467 B1 * | 7/2015 | Xie ................... H01L 29/66545 |
| 9,257,348 B2 | 2/2016 | Xie et al. |
| 2013/0299918 A1 | 11/2013 | Kim et al. |
| 2014/0209998 A1 | 7/2014 | Masuoka et al. |
| 2015/0115363 A1 | 4/2015 | Chang et al. |
| 2015/0187865 A1 | 7/2015 | Barabash et al. |
| 2015/0206963 A1 | 7/2015 | Ho et al. |
| 2015/0311445 A1 | 10/2015 | Udaka et al. |
| 2015/0340462 A1 | 11/2015 | Xie et al. |

(Continued)

FOREIGN PATENT DOCUMENTS

| | | |
|---|---|---|
| CN | 103794505 A | 5/2014 |
| DE | 102013103057 A1 | 10/2013 |

(Continued)

*Primary Examiner* — Brook Kebede
(74) *Attorney, Agent, or Firm* — Slater Matsil, LLP

(57) ABSTRACT

A FinFET device includes a substrate, a fin formed on the substrate, and a gate electrode crossing the fin. The gate electrode includes a head portion and a tail portion, and the tail portion is connected to the head portion and extended toward the substrate. The width of the head portion is greater than that of the tail portion.

20 Claims, 16 Drawing Sheets

(56) References Cited

U.S. PATENT DOCUMENTS

2016/0020149 A1 1/2016 Kim et al.
2016/0293604 A1 10/2016 Liaw

FOREIGN PATENT DOCUMENTS

| KR | 20130126313 A | 11/2013 |
| KR | 1020150086165 A | 7/2015 |
| TW | 201347194 A | 11/2013 |
| TW | 201513231 A | 4/2015 |
| TW | 201517272 A | 5/2015 |

\* cited by examiner

FINFET DEVICE AND FABRICATING METHOD THEREOF

RELATED APPLICATIONS

This application is a divisional of U.S. application Ser. No. 14/994,057, filed Jan. 12, 2016, entitled "FinFET Device and Fabricating Method Thereof", which claims priority to U.S. Provisional Application No. 62/214,800, filed Sep. 4, 2015, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation.

The smaller feature size is the use of multigate devices such as fin field effect transistor (FinFET) devices. FinFETs are so called because a gate is formed on and around a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
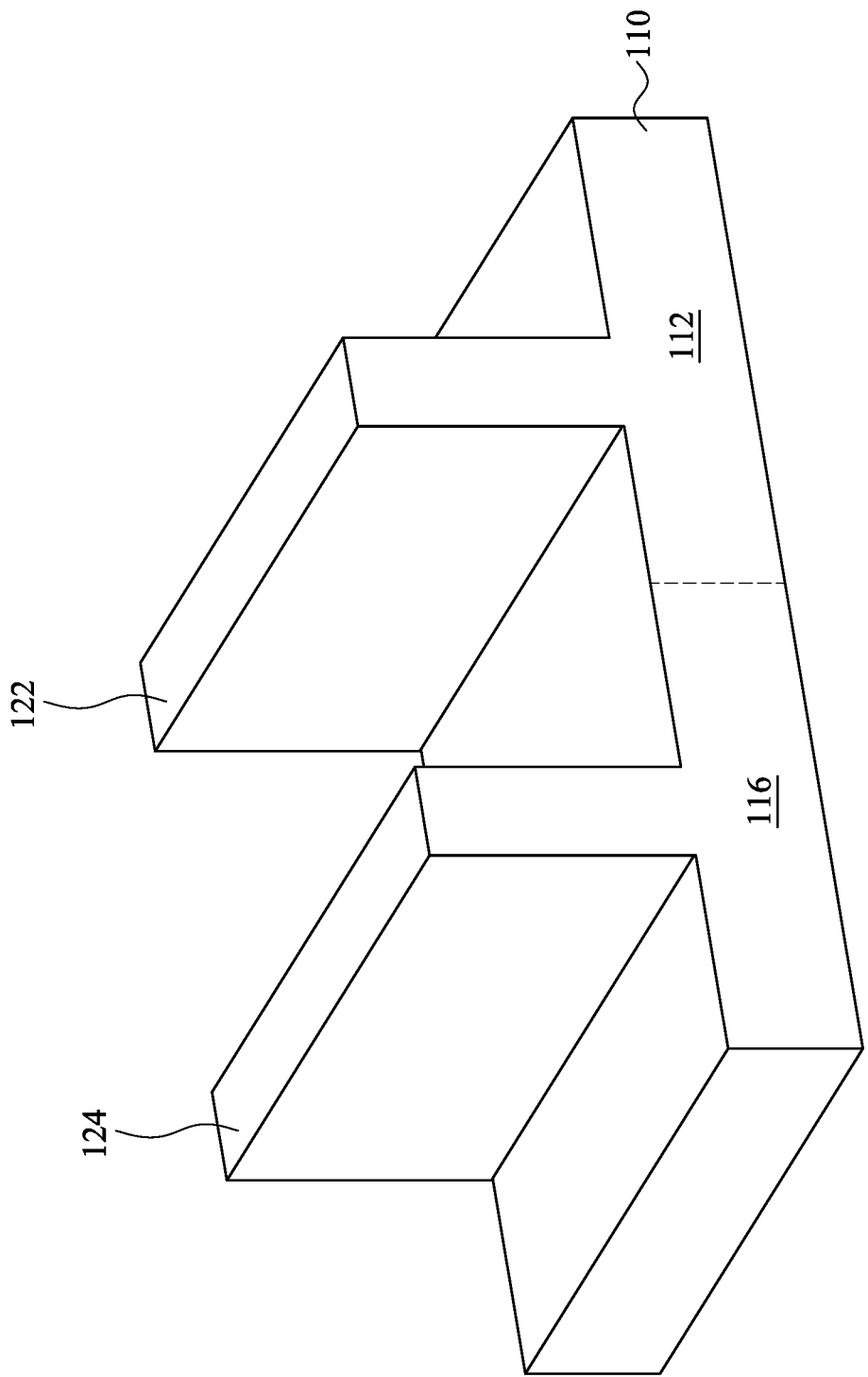
FIG. 1A to FIG. 1G are schematic oblique views of different steps of a method of fabricating a FinFET device, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FinFET devices include semiconductor fins with high aspect ratios and in which channel and source/drain regions of semiconductor transistor devices are formed. A gate is formed over the fins and dummy gates are formed along the sides of the fin devices utilizing as increased surface area of the channel and source/drain regions to produce faster, more reliable and better-controlled semiconductor transistor devices.

FIG. 1A to FIG. 1G are schematic oblique views of a method for manufacturing the FinFET component of the semiconductor device at various stages, in accordance with some embodiments of the present disclosure.

Reference is made to FIG. 1A. A substrate 110 is provided. In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

A plurality of p-well regions 116 and a plurality of n-well regions 112 are formed in the substrate 110. One of the n-well regions 112 is formed between two of the p-well regions 116. The p-well regions 116 are implanted with P dopant material, such as boron ions, and the n-well regions 112 are implanted with N dopant material such as arsenic ions. During the implantation of the p-well regions 116, the n-well regions 112 are covered with masks (such as photoresist), and during implantation of the n-well regions 112, the p-well regions 116 are covered with masks (such as photoresist).

A plurality of semiconductor fins 122, 124 is formed on the substrate 110. The semiconductor fins 122 are formed on the p-well regions 116, and the semiconductor fins 124 are formed on the n-well regions 112. In some embodiments, the semiconductor fins 122, 124 include silicon. It is note that the number of the semiconductor fins 122, 124 in FIG. 1A is illustrative, and should not limit the claimed scope of the present disclosure. A person having ordinary skill in the art may select suitable number for the semiconductor fins 122, 124 according to actual situations.

The semiconductor fins 122, 124 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 122, 124 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Figure 1B:
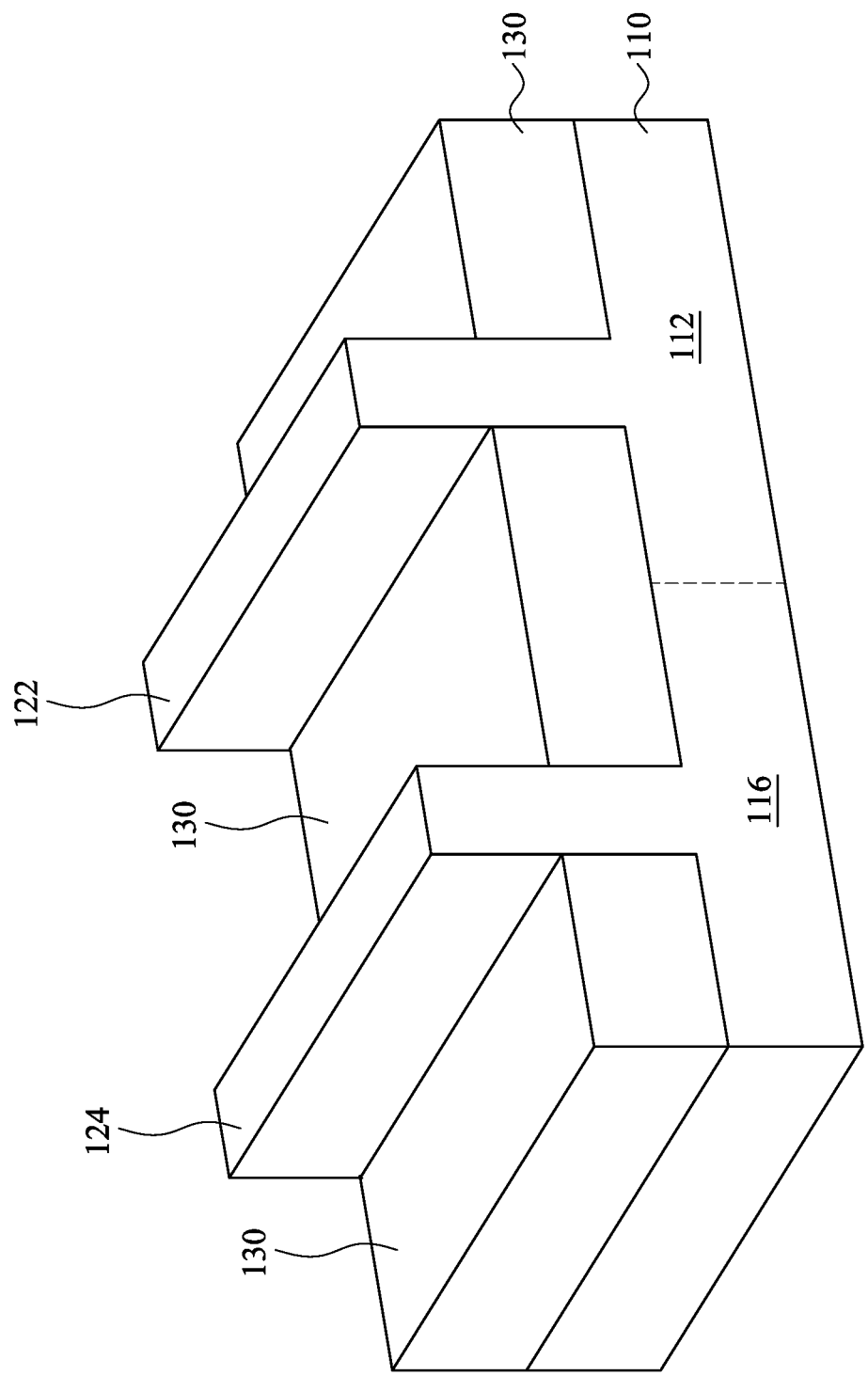

Reference is made to FIG. 1B. A plurality of isolation structures 130 are formed on the substrate 110. The isolation structures 130, which act as a shallow trench isolation (STI) around the semiconductor fins 122, 124 may be formed by chemical vapor deposition (CVD) techniques using tetra-ethyl-ortho-silicate (TEOS) and oxygen as a precursor. In yet some other embodiments, the isolation structures 130 are insulator layers of a SOI wafer.

Figure 1C:
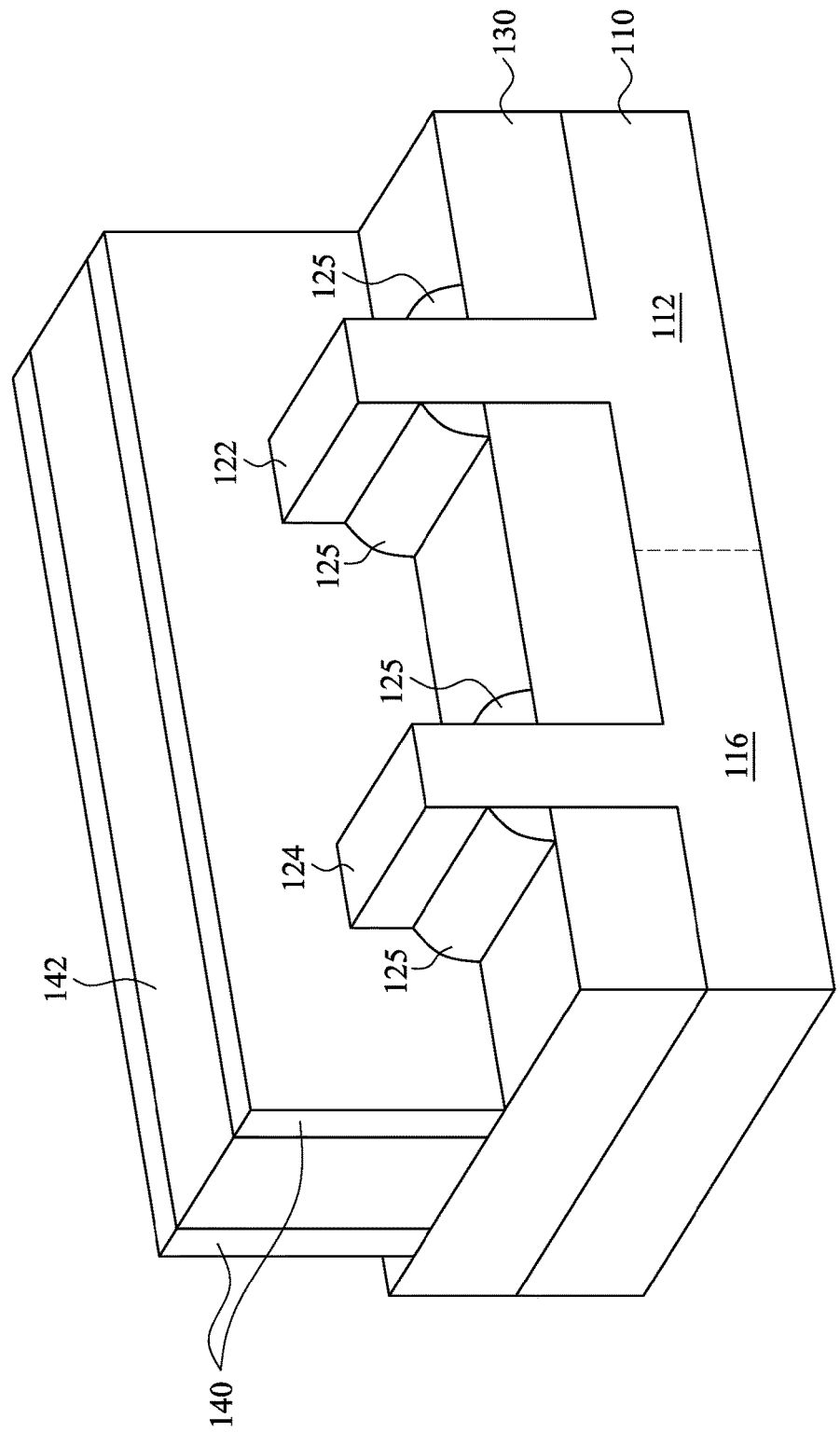

Reference is made to FIG. 1C. At least one dummy gate 142 is formed on portions of the semiconductor fins 122, 124 and exposes another portions of the semiconductor fins 122, 124. The dummy gate 142 may be formed crossing multiple semiconductor fins 122, 124.

As shown in FIG. 1C, a plurality of gate spacers 140 are formed over the substrate 110 and along the side of the dummy gate 142. In some embodiments, the gate spacers 140 may include silicon oxide, silicon nitride, silicon oxynitride, or other suitable material. The gate spacers 140 may include a single layer or multilayer structure. A blanket layer of the gate spacers 140 may be formed by CVD, PVD, ALD, or other suitable technique. Then, an anisotropic etching is performed on the blanket layer to form a pair of the gate spacers 140 on two sides of the dummy gate 142. In some embodiments, the gate spacers 140 are used to offset subsequently formed doped regions, such as source/drain regions. The gate spacers 140 may further be used for designing or modifying the source/drain region (junction) profile.

A plurality of dielectric fin sidewall structures 125 are formed on opposite sides of the semiconductor fins 122, 124. The dielectric fin sidewall structures 125 are formed along the semiconductor fins 122, 124. The dielectric fin sidewall structures 125 may include a dielectric material such as silicon oxide. Alternatively, the dielectric fin sidewall structures 125 may include silicon nitride, SiC, SiON, or combinations thereof. The formation methods for the dielectric fin sidewall structures 125 may include depositing a dielectric material over the semiconductor fins 122, 124, and then anisotropically etching back the dielectric material. The etching back process may include a multiple-step etching to gain etch selectivity, flexibility and desired overetch control.

In some embodiments, the gate spacers 140 and the dielectric fin sidewall structures 125 may be formed in the same manufacturing process. For example, a blanket layer of dielectric layer may be formed to cover the dummy gate 142 and the semiconductor fins 122, 124 by CVD, PVD, ALD, or other suitable technique. Then, an etching process is performed on the blanket layer to form the gate spacers 140 on opposite sides of the dummy gate 142 and form the dielectric fin sidewall structures 125 on opposite sides of the semiconductor fins 122, 124. However, in some other embodiments, the gate spacers 140 and the dielectric fin sidewall structures 125 can be formed in different manufacturing processes.

Figure 1D:
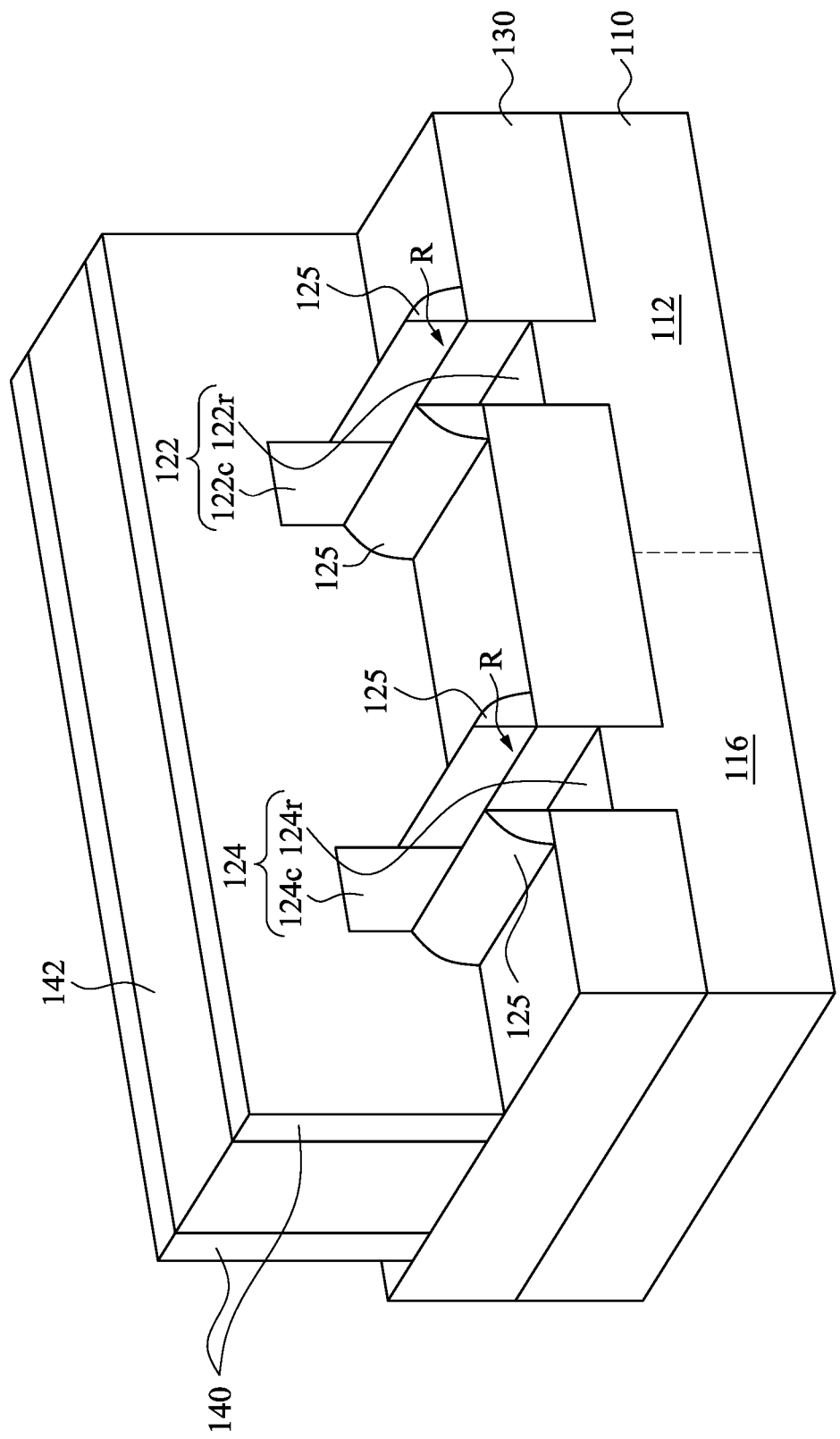

Reference is made to FIG. 1D. A portion of the semiconductor fins 122, 124 exposed both by the dummy gate 142 and the gate spacers 140 are partially removed (or partially recessed) to form recesses R in the semiconductor fins 122, 124. In some embodiments, the recesses R are formed with the dielectric fin sidewall structures 125 as its upper portion. In some embodiments, sidewalls of the recesses R are substantially and vertical parallel to each other. In some other embodiments, the recesses R are formed with a non-vertical parallel profile.

In FIG. 1D, the semiconductor fin 122 includes at least one recessed portion 122r and at least one channel portion 122c. The recess R is formed on the recessed portion 122r, and the dummy gate 142 covers the channel portion 122c. The semiconductor fin 124 includes at least one recessed portion 124r and at least one channel portion 124c. The recess R is formed on the recessed portion 124r, and the dummy gate 142 covers the channel portion 124c.

The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 1E:
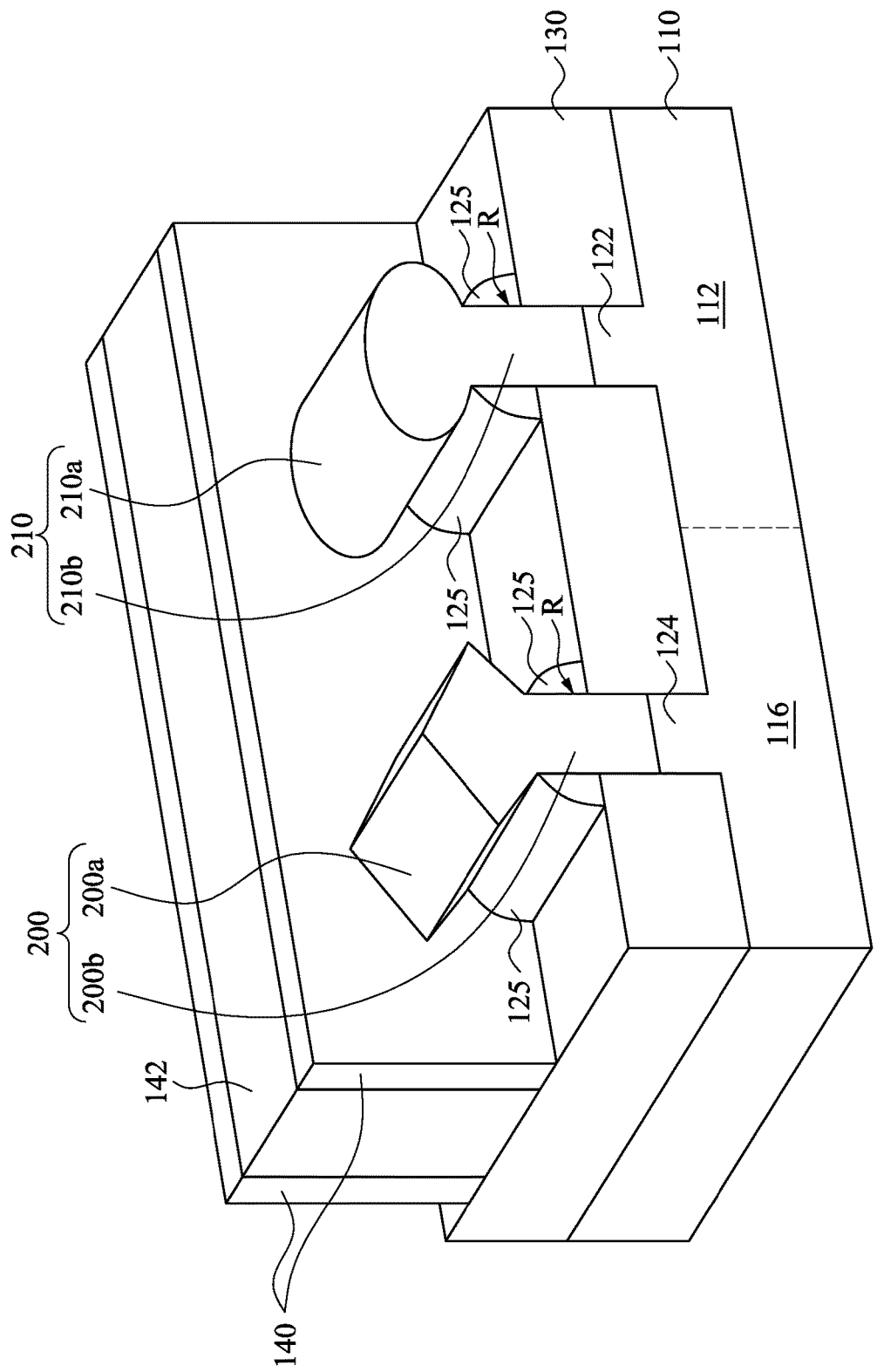

Reference is made to FIG. 1E. A plurality of epitaxy structures 200 are respectively formed in the recesses R of the semiconductor fins 124, and a plurality of epitaxy structures 210 are respectively formed in the recesses R of the semiconductor fins 122. The epitaxy structure 200 is separated from the adjacent epitaxy structure 210. The epitaxy structures 200 and 210 protrude from the recesses R. The epitaxy structures 200 can be n-type epitaxy structures, and the epitaxy structures 210 can be p-type epitaxy structures. The epitaxy structures 200 and 210 may be formed using one or more epitaxy or epitaxial (epi) processes, such that Si features, SiGe features, and/or other suitable features can be formed in a crystalline state on the semiconductor fins 122, 124. In some embodiments, lattice constants of the epitaxy structures 200 and 210 are different from lattice constants of the semiconductor fins 122, 124, and the epitaxy structures 200 and 210 are strained or stressed to enable carrier mobility of the SRAM device and enhance the device performance. The epitaxy structures 200 and 210 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 200 and 210 are formed in different epitaxy processes. The epitaxy structures 200 may include SiP, SiC, SiPC, Si, III-V compound semiconductor materials or combinations thereof, and the epitaxy structures 210 may include SiGe, SiGeC, Ge, Si, III-V compound semiconductor materials, or combinations thereof. During the formation of the epitaxy structures 200, n-type impurities such as phosphorous or arsenic may be doped with the proceeding of the epitaxy. For example, when the epitaxy structure 200 includes SiC or Si, n-type impurities are doped. Moreover, during the formation of the epitaxy structures 210, p-type impurities such as boron or $BF_2$ may be doped with the proceeding of the epitaxy. For example, when the epitaxy structure 210 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 122, 124 (e.g., silicon). Thus, a strained channel can be achieved to increase carrier mobility and enhance device performance. The epitaxy structures 200 and 210 may be in-situ doped. If the epitaxy structures 200 and 210 are not in-situ doped, a second implantation process (i.e., a junction implant process) is performed to dope the epitaxy structures 200 and 210. One or more annealing processes may be performed to activate the epitaxy structures 200 and 210. The annealing processes include rapid thermal annealing (RTA) and/or laser annealing processes.

In some embodiments, the epitaxy structure 200 has a top portion 200a and a body portion 200b disposed between the top portion 200a and the substrate 110. A width of the top portion 200a is wider than a width of body portion 210b. The dielectric fin sidewall structures 125 are disposed on opposite sides of the body portions 200b of the epitaxy structures 200, and the top portion 200a of the epitaxy structures 200 is disposed on the dielectric fin sidewall structures 125.

Moreover, the epitaxy structure 210 has a top portion 210a and a body portion 210b disposed between the top portion 210a and the substrate 110. The width of the top portion 210a is wider than a width of the body portion 210b. The dielectric fin sidewall structures 125 are disposed on opposite sides of the body portions 210b of the epitaxy structures 210, and the top portion 210a of the epitaxy structures 210 is disposed on the dielectric fin sidewall structures 125. The epitaxy structures 200 and 210 are utilized as source/drain regions of inverters.

In some embodiments, the epitaxy structures 200 and 210 have different shapes. The top portions 200a of the epitaxy structures 200 can have at least one substantially facet surface presented above the dielectric fin sidewall structures 125, and the top portions 210a of the epitaxy structures 210 can have at least one non-facet (or round) surface presented above the dielectric fin sidewall structures 125, and the claimed scope is not limited in this respect.

Figure 1F:
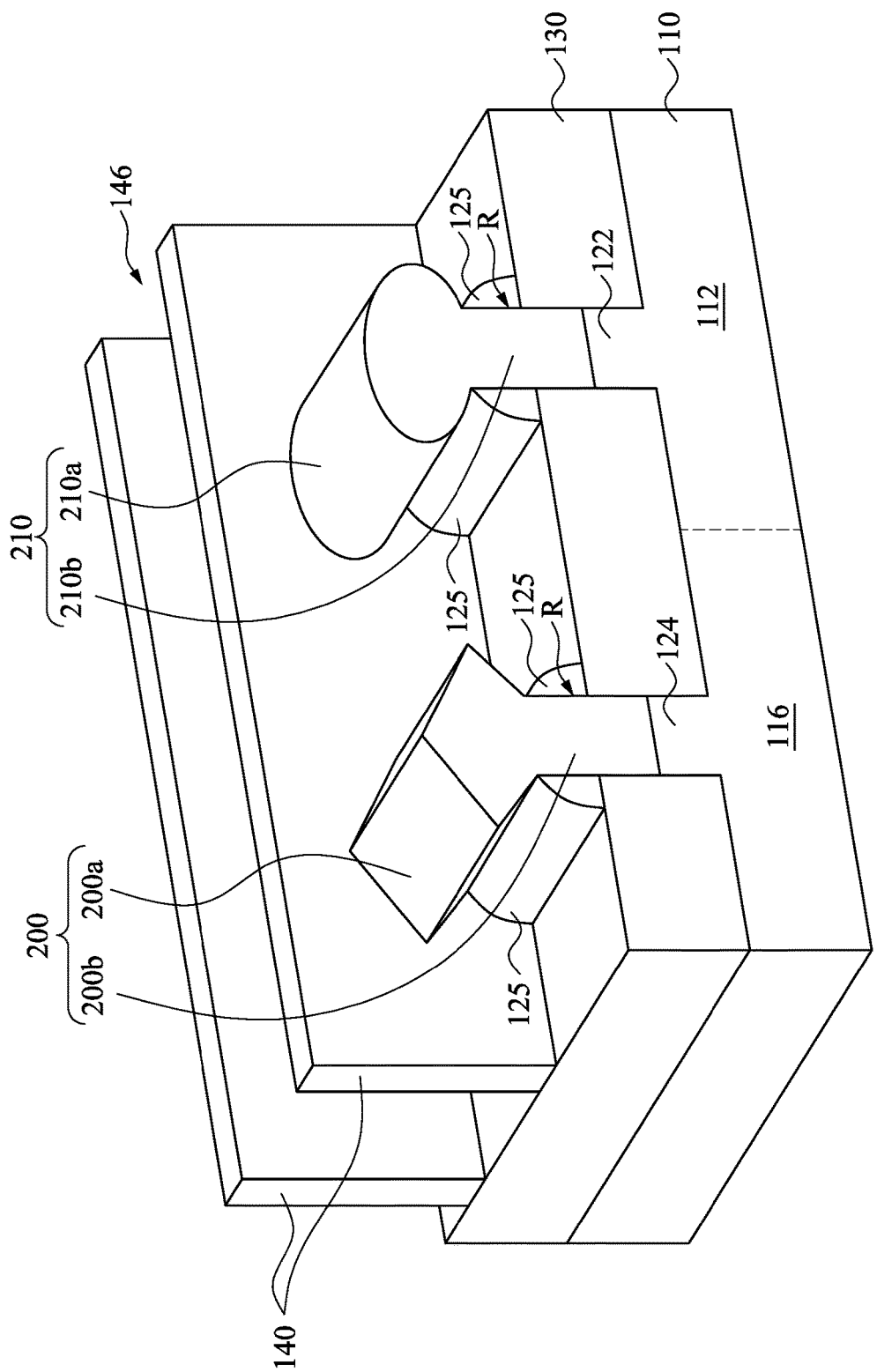

Reference is made to FIG. 1F. After the epitaxy structures 200 and 210 are formed, the dummy gate 142 is removed, thus a trench 146 is formed between the gate spacer 140. The isolation structure 130 and a portion of the semiconductor fins 122, 124 are exposed from the trench 146. The dummy gate 142 can be removed by performing one or more etching processes.

Figure 1G:
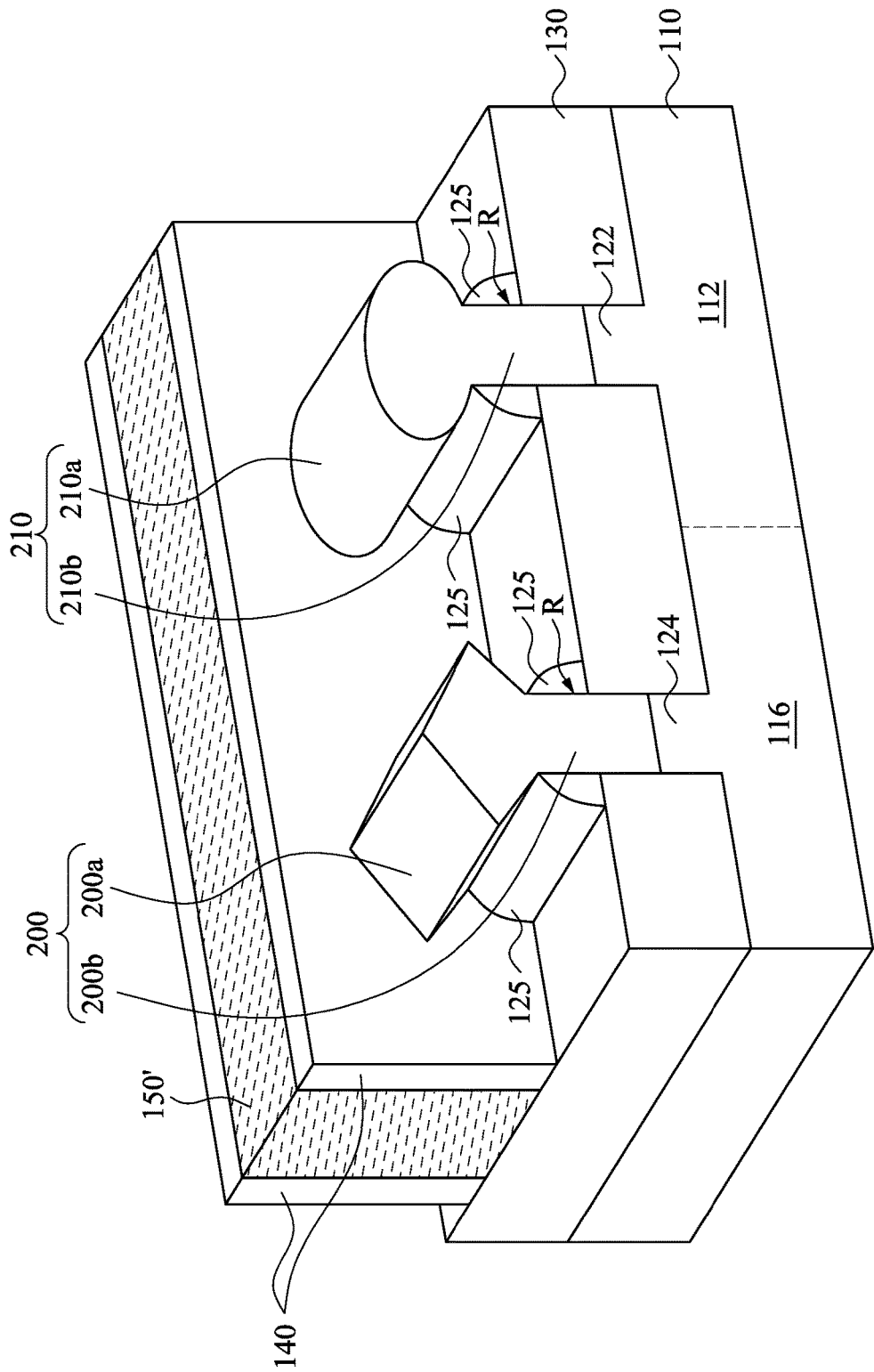

Referring to FIG. 1G, a gate stack 150' is formed and fills the trench 146. Details of filling the gate stack 150' are discussed from FIG. 2A to FIG. 2G, in which FIG. 2A to FIG. 2G follow after FIG. 1F. FIG. 2A to FIG. 2G are cross-sectional views illustrating the process of forming the gate stack 150' in accordance with some embodiments of the disclosure.

Figure 2A:
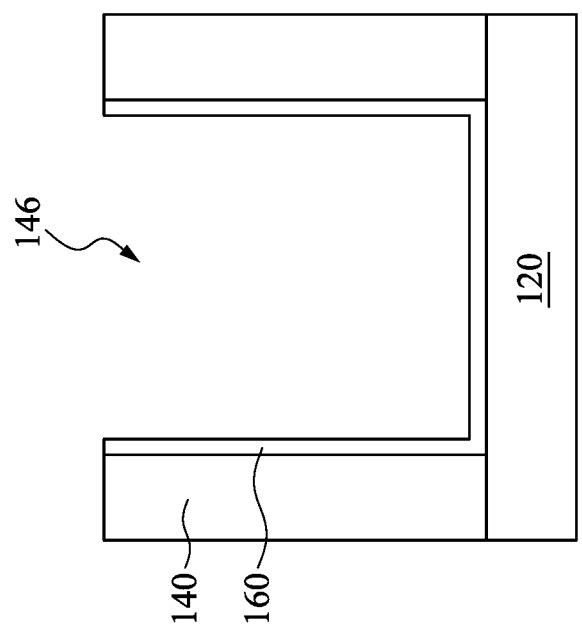
FIG. 2A to FIG. 2G are cross-sectional views illustrating the process of forming the gate electrode 150, in accordance with some embodiments of the disclosure.

Referring to FIG. 2A, the dummy gate is removed thereby exposing the trench 146 in the gate spacer 140. A gate insulator layer 160 is formed on the sidewall of the gate spacer 140. The gate insulator layer 160 is a dielectric material such as, silicon nitride, silicon oxinitride, dielectric with a high dielectric constant (high-k), and/or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide and/or combinations thereof. The gate insulator layer can be formed by a deposition process, such as an ALD process, a CVD process, a PVD process or a sputter deposition process.

Figure 2C:
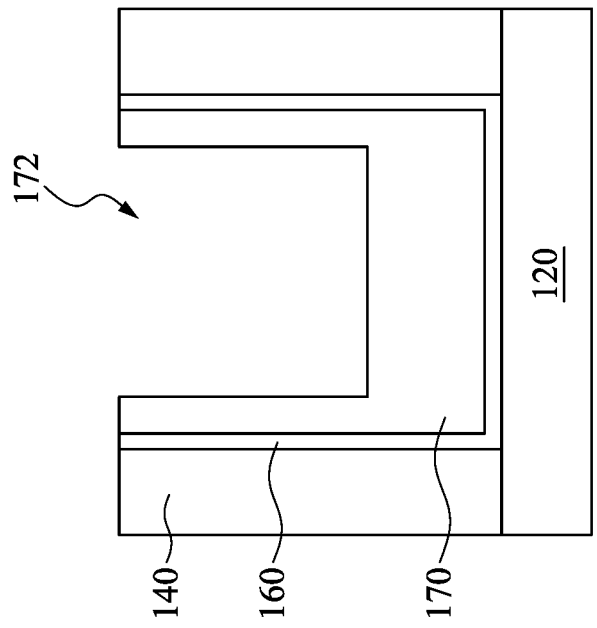
Figure 2B:
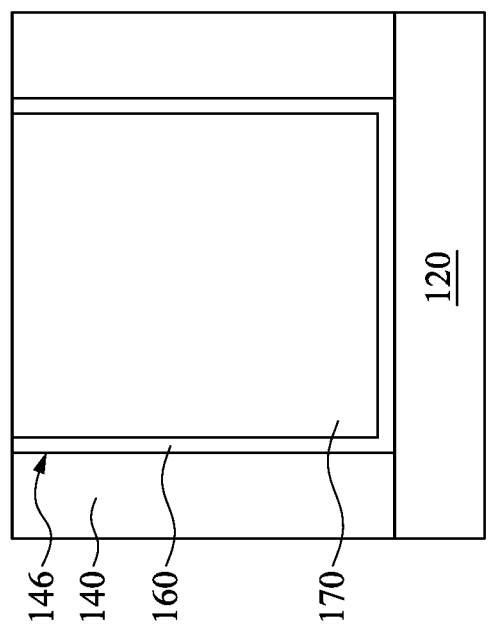

Referring to FIG. 2B, a work function metal layer 170 is filled into the cavity formed between the gate insulator layer 160. In some embodiments, the FinFET device can be a NMOS device, and the work function metal layer 170 can be made of, for example, Ti, Ag, Al, TiAlMo, Ta, TaN, TiAlC, TiAlN, TaC, TaCN, TiAl, TaSiN, Mn, Zr, or combinations thereof. Alternatively, in some other embodiments, the FinFET device can be a PMOS device, and the work function metal layer 170 can be made of, for example, TiN, W, Ta, Ni, Pt, Ru, Mo, Al, WN, or combinations thereof. The work function metal layer 170 can be formed by a deposition process, such as an ALD process, a CVD process, PECVD process, a PVD process or a sputter deposition process.

In some embodiments, a barrier layer is optionally formed between the work function metal layer 170 and the gate insulator layer 160. The barrier layer can be a metal layer. The barrier layer can be formed by a deposition process, such as an ALD process, a CVD process, a PECVD process, a PVD process or a sputter deposition process.

Referring to FIG. 2C, an upper portion at the center of the work function metal layer 170 is removed thereby forming a trench 172 in the work function metal layer 170. The trench 172 may be formed using a masking layer (not shown) along with a suitable etching process. For example, the masking layer may be a hardmask including silicon nitride formed through a process such as a CVD process, although other materials, such as oxides, oxynitrides, silicon carbide, combinations of these, or the like, and other processes, such as plasma enhanced CVD (PECVD), low pressure CVD (LPCVD), or even silicon oxide formation followed by nitridation, may alternatively be utilized. Once formed, the masking layer may be patterned through a suitable photolithographic process to expose those portions of the work function metal layer 170 that will be removed to form the trench 172. Alternatively, the trench 172 may be formed by performing a dry etching process in some other embodiments. The masking layer is removed after the trench 172 is formed.

Figure 2E:
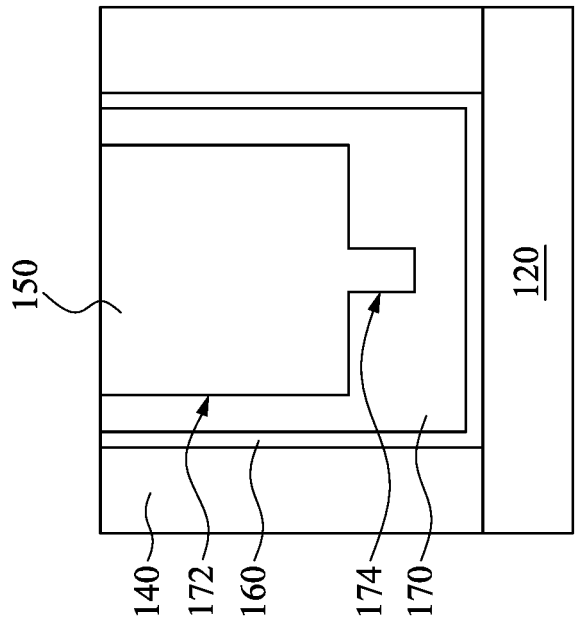
Figure 2D:
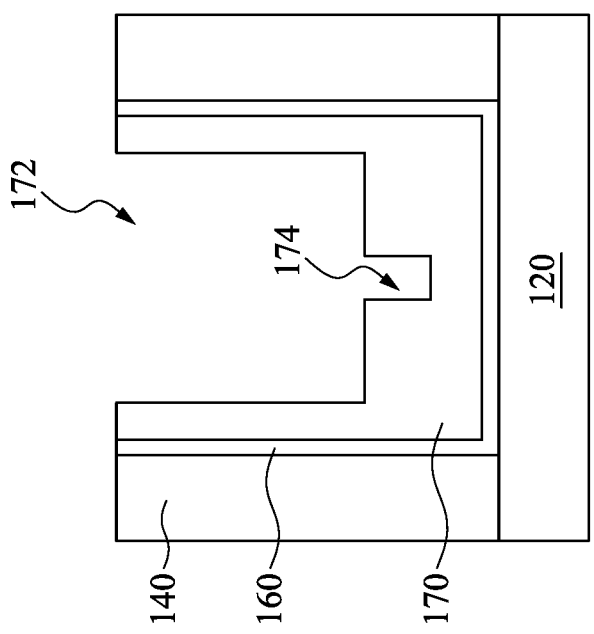

Referring to FIG. 2D, the work function metal layer 170 under the trench 172 is patterned to form another trench 174 under the trench 172. For example, the portion of aside the predetermined position of the trench 174 in once again protected by another masking layer. Thus the portion of the work function metal layer 170 for forming the trench 174 is exposed from the masking layer. The exposed portion of the work function metal layer 170 is removed by, such as dry etching process. The trench 174 has higher aspect ration than that of the trench 172, the width of the trench 174 is smaller than the width of the trench 172. The masking layer is removed after the trench 174 is formed.

Reference is made to FIG. 2E. After the trenches 172 and 174 are formed, the low resistance material, such as metal is filled into the trenches 172 and 174. The metal can fill into the trenches 172 and 174 by a deposition process, such as an ALD process, a CVD process, a PECVD process, a PVD process or a sputter deposition process. A gate electrode 150 is formed after the metal fills the trenches 172 and 174. The gate electrode 150 can be a single layer structure or a multi-layer structure. The material of the gate electrode 150 includes Al, W, Co, Cu or suitable alloy thereof.

The aspect ratio of the trench 172 is lower than the aspect ratio of the trench 174. Therefore, filling the metal into the trench 172 is easier than filling the metal into the trench 174. In the situation without the trench 172 (e.g. only the trench 174 with high aspect ratio is formed), the process of filling the metal into the trench 174 is difficult because of the high aspect ratio thereof. Thus unwanted voids may be formed after the metal fills into the trench 174 thereby affecting the efficiency of the FinFET device 100. However, in the embodiments of the disclosure, by introducing the trench 172 with lower aspect ratio above the trench 174, the deposition of metal can be performed easier and have good quality. The efficiency of the FinFET device 100 including the trenches 172 and 174 can be improved accordingly.

Figure 2G:
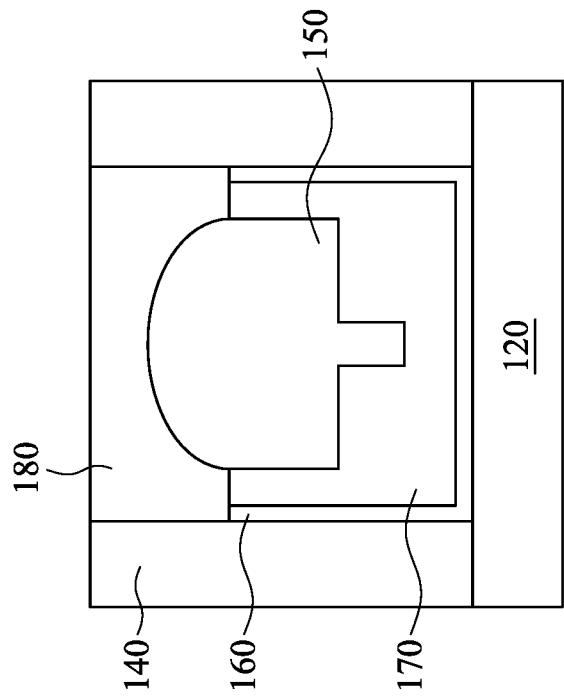
Figure 2F:
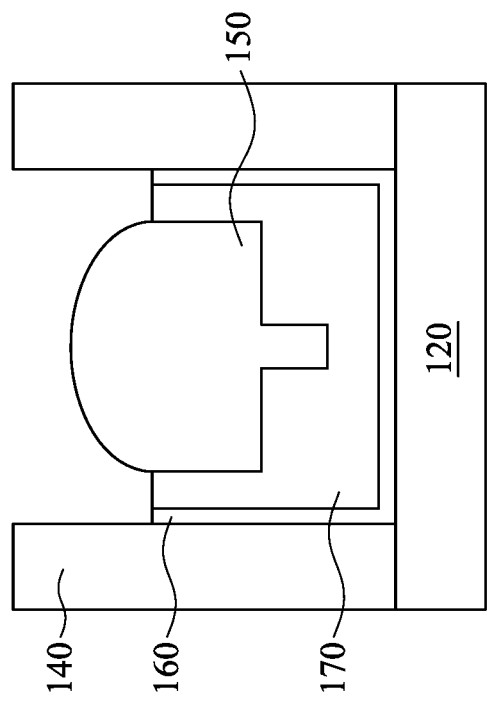

Referring to FIG. 2F, the upper portions of the gate insulator layer 160, the work function metal layer 170, and the gate electrode 150 are removed. The gate insulator layer 160, the work function metal layer 170, and the gate electrode 150 can be removed by using any suitable process, such as performing a wet etching process or a dry etching process. Because of the material differences between the gate insulator layer 160, the work function metal layer 170, and the gate electrode 150, the shape of the remaining gate electrode 150 is different from that of the remaining work function metal layer 170.

For example, the top portion of the gate insulator layer 160, the work function metal layer 170, and the gate electrode 150 are removed by performing an etching process, the sidewall of the gate spacer 140 is exposed after the top portion of the gate insulator layer 160, the work function metal layer 170, and the gate electrode 150 are removed. The gate spacer 140 is protected by the masking layer during performing the dry etching process, such that the sidewall of the gate spacer 140 remains substantially vertical. The gate electrode 150 has a dome cross-sectional top surface, and the work function metal layer 170 has a substantially plane or inclined cross-sectional profile. The dome cross-sectional top surface of the gate electrode 150 means the gate electrode 150 has a curve top surface, and the height of the gate electrode 150 at the center portion is greater than that at the edge portion.

Referring to FIG. 2G, after the top portion of the gate insulator layer 160, the work function metal layer 170, and the gate electrode 150 are removed, a cap layer 180 is formed on the gate insulator layer 160, the work function metal layer 170, and the gate electrode 150. The cap layer 180 covers the gate insulator layer 160, the work function metal layer 170, and the gate electrode 150. The cap layer 180 can be formed by a deposition process, such as an ALD process, a CVD process, a PECVD process, a PVD process or a sputter deposition process. The cap layer 180 is made of dielectric material, such as silicon nitride. A planarization process for example, chemical mechanical polish (CMP) is performed to remove excess portions of the cap layer 180 and the masking layer for flattening the top surface of the cap layer 190.

Figure 3B:
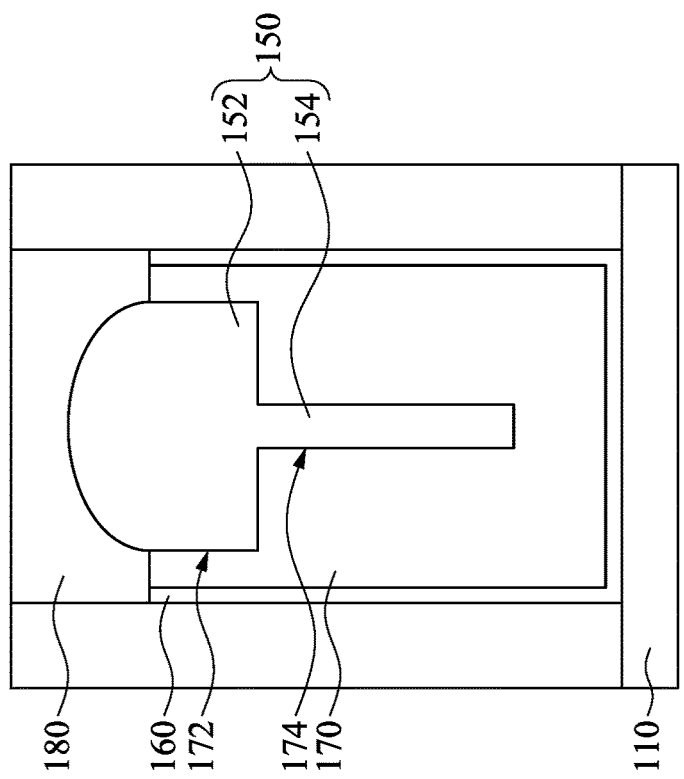
FIG. 3A and FIG. 3B are local cross-sectional views of the FinFET device according to some embodiments of the disclosure.
Figure 3A:
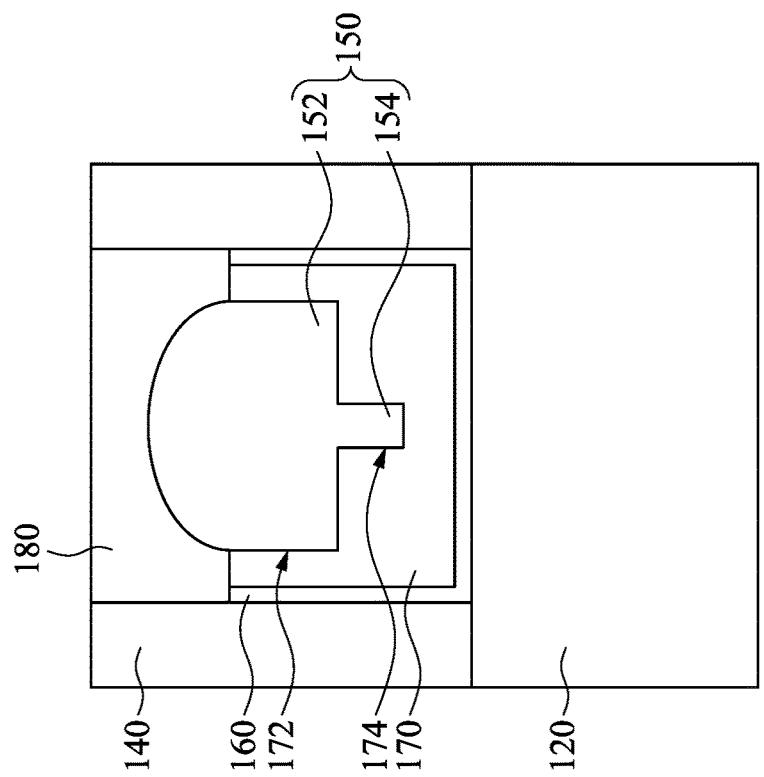

Reference is made to FIG. 3A and FIG. 3B, in which FIG. 3A and FIG. 3B are local cross-sectional views of the FinFET device according to some embodiments of the disclosure. FIG. 3A is taken along line A-A of FIG. 1F, and FIG. 3B is taken along line B-B of FIG. 1F. The gate electrode 150 is formed crossing the fin 120 which can be the semiconductor fin 122 or 124). The gate electrode 150 is formed between the gate spacer 140. The gate insulator layer 160 is formed coating the sidewall of the gate spacer 140, and the work function metal layer 170 is formed between the gate electrode 150 and the gate insulator layer 160. The cap layer 180 covers the gate electrode 150 and the work function metal layer 170.

The gate electrode 150 includes a head portion 152 and a tail portion 154, in which the head portion 152 fills the trench 172, and the tail portion 154 fills the trench 174. The tail portion 154 is connected to and is integrated formed with the head portion. The head portion 152 is formed on the tail portion 154, and the tail portion 154 is extended toward the substrate 110.

The top of the head portion 152 is protruded from the work function metal layer 170. The head portion 152 has a curve top surface as a dome. The width of the head portion 152 is greater than the width of the tail portion 154. Since the aspect ratio of the trench 174 becomes higher and higher, such as the trench 174 between the fins 120 as illustrated in FIG. 3B, the process of filling metal into the trench 174 becomes difficult accordingly. The head portion 152 with wider width can be utilized to improve the metal filling ability of forming the tail portion 154. Furthermore, by introducing the head portion 152, the thickness of the work function metal layer 170 and/or the height of the gate electrode can be adjusted, such that the threshold voltage of the FinFET device 100 can be tuned accordingly.

However, as one of ordinary skill in the art will recognize, the processes and materials described are not meant to limit the present disclosure. Other suitable processes and materials may be utilized. Variations of the processes, operation parameters, and materials may occurs to different profiles of gate electrode 150 and the work function metal layer 160, such as the embodiments illustrated in FIG. 4A to FIG. 7B. FIG. 4A to FIG. 7B are local cross-sectional views of a FinFET device in accordance with different embodiments of the disclosure, in which FIG. 4A, FIG. 5A, FIG. 6A and FIG. 7A are cross-sectional views taken along for example, the line A-A of FIG. 1F, and FIG. 4B, FIG. 5B, FIG. 6B, and FIG. 7B are cross-sectional views taken along for example, the line B-B of FIG. 1G.

Figure 4B:
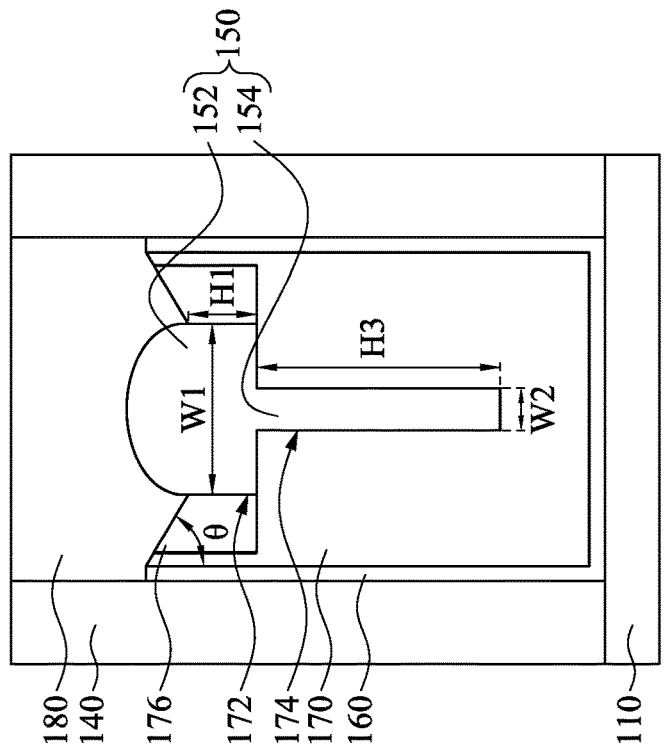
FIG. 4A and FIG. 4B are local cross-sectional views of the FinFET device according to some embodiments of the disclosure.
Figure 4A:
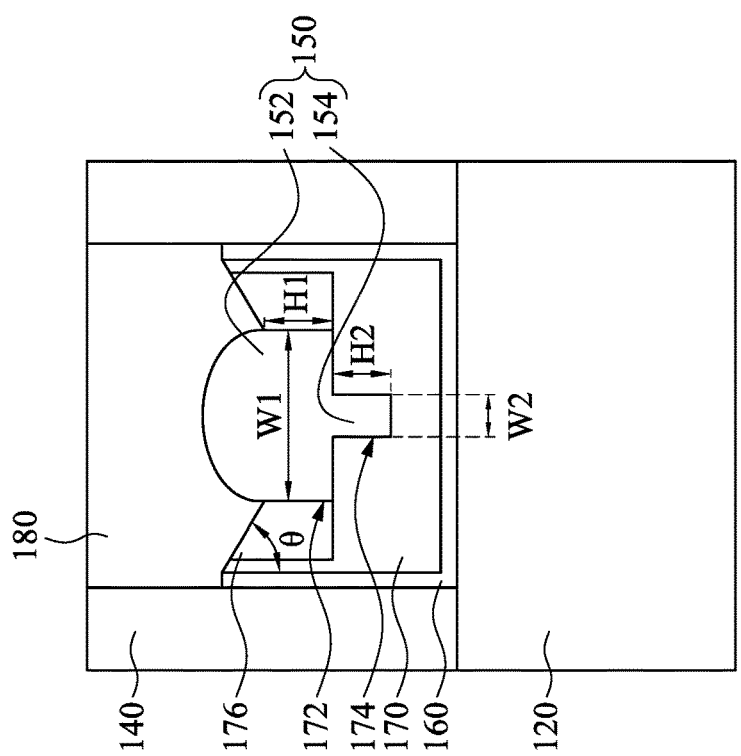

Reference is made to FIG. 4A and FIG. 4B, the FinFET device 100 of this embodiment is utilized in a PMOS device. The P-type work function metal layer 170 surrounding the gate electrode 150 can be TaN or TiN layer. The gate electrode 150 includes W or AlCu. In some embodiments, the PMOS devices are fabricated with the NMOS devices, thus the N-type work function layer 172, such as TiAl layer is also formed in the trench 172. The head portion 152 is surrounded by the P-type work function metal layer 170 and the N-type work function metal layer 176 and is directly in contact with the N-type work function metal layer 176. However, the N-type work function layer 172 is only deposited in the trench 172 with lower aspect ratio where the head portion 152 is formed. Namely, the N-type work function metal layer 176 does not extend into the trench 174 where the tail portion 154 is formed, thus the tail portion 154 which provides gate function is surrounded by and directly contact with the P-type work function metal layer 170.

The gate electrode 150 has the head portion 152 having a width W1 and the tail portion 154 having a width W2. The width W2 of the tail portion 154 is shorter than the width W1 of the head portion 152. The ratio of the W2/W1 is in a range from about 0.2 to about 0.8. The head portion 152 has a dome top surface. The part of the head portion 152 hidden in the N-type work function metal layer 176 has a height H1. The tail portion 154 hidden in the P-type work function metal layer 170 has a height H2 above the fin 120 (referring to FIG. 4A). The tail portion 154 hidden in the P-type work function metal layer 170 has a height H3 aside the fin 120 or between the fins 120 (referring to FIG. 4B). The height H3 of the tail portion 154 between the fins 120 is greater than the height H2 of the tail portion 154 above the fin 120. The ratio of H2/H1 is in a range from about 0.1 to about 0.3. The ratio of H3/H1 is in a range from about 0.3 to 3.0. The work function metal layers including the P-type work function metal layer 170 and the N-type work function metal layer 176 have a top surface, and an angle θ is defined between the top surface and the sidewall of the gate insulator layer 160. The top surface can be an inclined surface or a flat plane surface. Accordingly, the angle θ between the top surface of the work function metal layers 170, 172 and the gate insulator layer 160 is in a range from about 45 degrees to about 90 degrees. In some embodiments, the angle θ between the top surface of the work function metal layers 170, 172 and the gate insulator layer 160 is in a range from about 60 degrees to about 90 degrees to provide stable work function. The angle θ between the top surface of the work function metal layers 170, 172 and the gate insulator layer 160 can be adjusted by selecting proper material and process parameters.

Figure 5B:
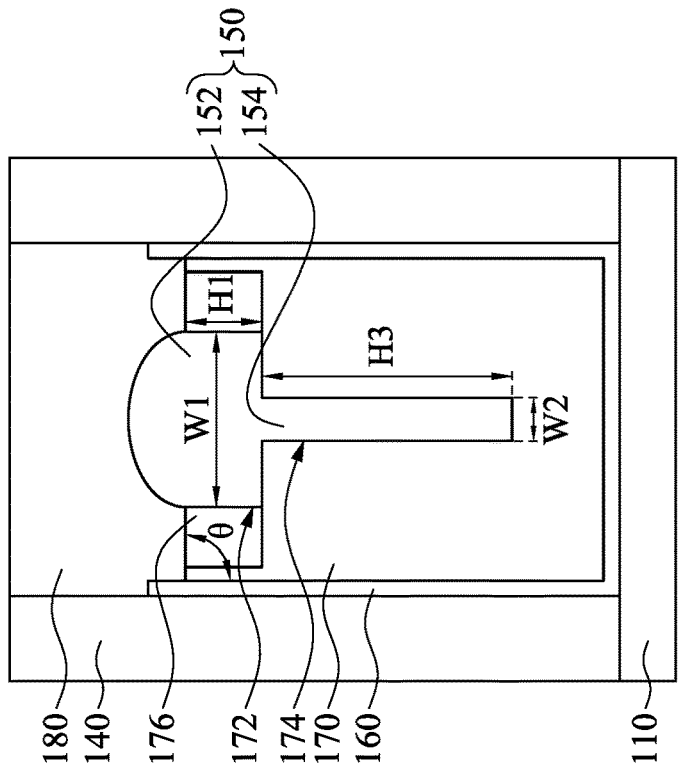
FIG. 5A and FIG. 5B are local cross-sectional views of the FinFET device according to some embodiments of the disclosure.
Figure 5A:
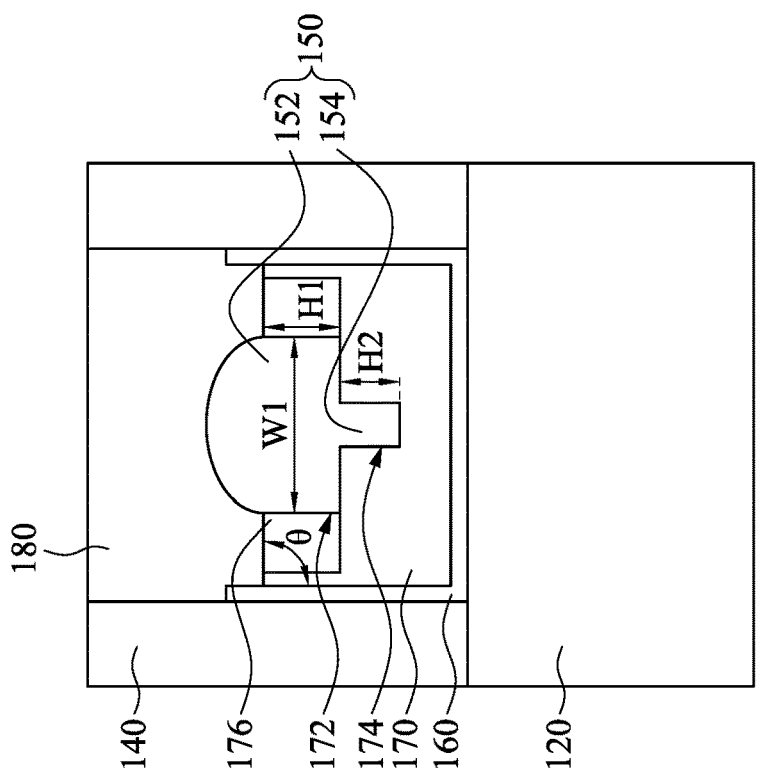

Referring to FIG. 5A and FIG. 5B, the FinFET device 100 of this embodiment is utilized in a PMOS device. The difference between this embodiment and FIGS. 4A and 4B is that the top surface of the work function metal layers is a flat plane surface, and the angle θ between the top surface of the work function metal layers 170, 172 and the gate insulator layer 160 is about 90 degrees.

Figure 6A:
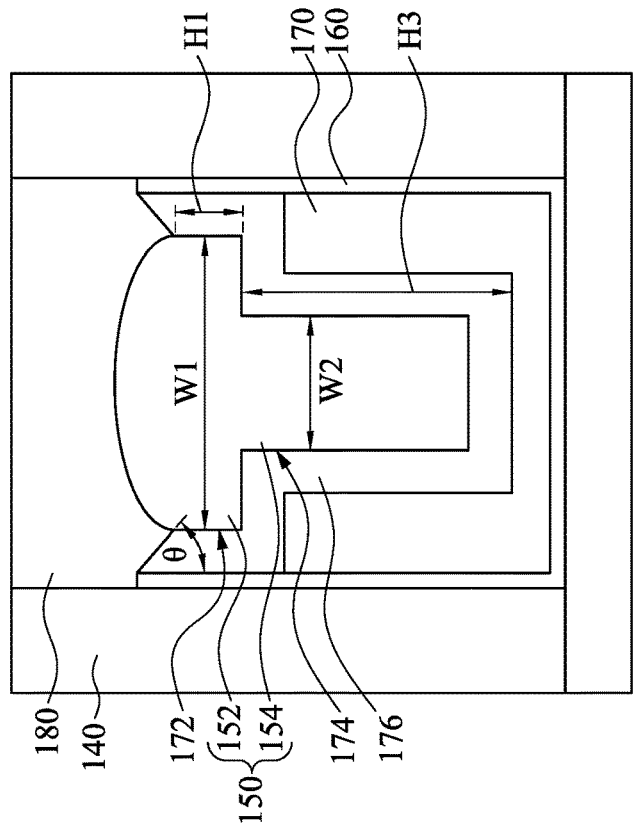
FIG. 6A and FIG. 6B are local cross-sectional views of the FinFET device according to some embodiments of the disclosure.
Figure 6B:
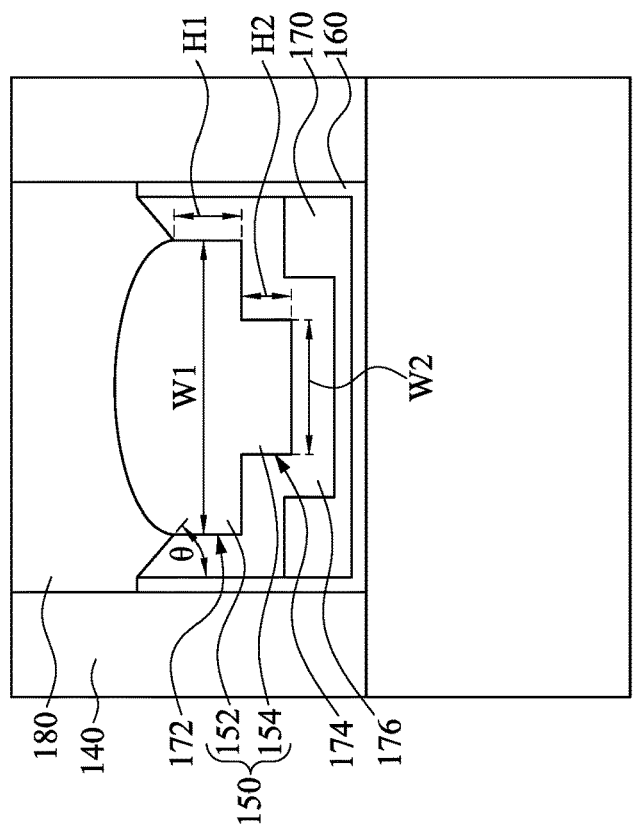

Referring to FIG. 6A and FIG. 6B, the FinFET device 100 of this embodiments is utilized in a NMOS device. In some embodiments, the NMOS devices are fabricated with the PMOS devices, thus the P-type work function layer 170 is also formed in the trenches 172 and 174. The P-type work function metal layer 170 surrounding the gate electrode 150 can be TaN or TiN layer. The gate electrode 150 includes W or AlCu. The N-type work function layer 172 is a TiAl layer. In NMOS device, the N-type work function layer 172 is deposited in both trenches 172 and 174. Namely, the N-type work function metal layer 176 extends into the trench 174 and surrounds both the head portion 152 and the tail portion 154. The head portion 152 is surrounded by the P-type work function metal layer 170 and the N-type work function metal layer 176 and is directly in contact with the N-type work function metal layer 176. The tail portion 154 which provides gate function is surrounded by both the P-type work function metal layer 170 and the N-type work function metal layer 176 and directly contact with the N-type work function metal layer 170.

The gate electrode 150 has the head portion 152 having a width W1 and the tail portion 154 having a width W2. The width W2 of the tail portion 154 is shorter than the width W1 of the head portion 152. The ratio of the W2/W1 is in a range from about 0.2 to about 0.8. The head portion 152 has a dome top surface. The part of the head portion 152 hidden in the N-type work function metal layer 176 has a height H1. The tail portion 154 hidden in the N-type work function metal layer 176 has a height H2 above the fin 120 (referring to FIG. 6A). The tail portion 154 hidden in the N-type work function metal layer 176 has a height H3 aside the fin 120 or between the fins 120 (referring to FIG. 6B). The height H3 of the tail portion 154 between the fins 120 is greater than the height H2 of the tail portion 154 above the fin 120. The ratio of H2/H1 is in a range from about 0.1 to about 0.3. The ratio of H3/H1 is in a range from about 0.3 to 3.0. The work function metal layers including the P-type work function metal layer 170 and the N-type work function metal layer 176 have a top surface, and an angle θ is defined between the top surface and the sidewall of the gate insulator layer 160. The top surface can be an inclined surface or a flat plane surface. Accordingly, the angle θ between the top surface of the work function metal layers 170, 172 and the gate insulator layer 160 is in a range from about 45 degrees to about 90 degrees. In some embodiments, the angle θ between the top surface of the work function metal layers 170, 172 and the gate insulator layer 160 is in a range from about 60 degrees to about 90 degrees to provide stable work function. The angle θ between the top surface of the work function metal layers 170, 172 and the gate insulator layer 160 can be adjusted by selecting proper material and process parameters.

Figure 7B:
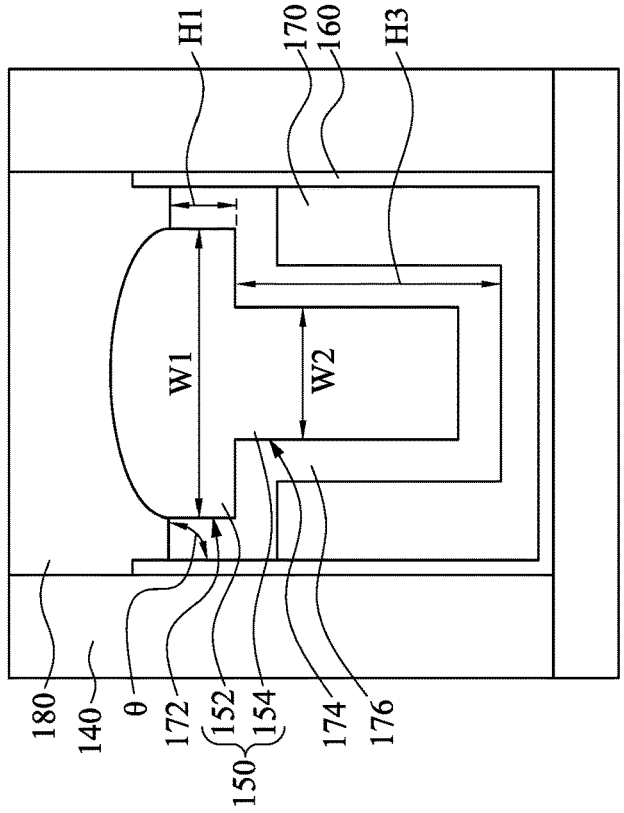
FIG. 7A and FIG. 7B are local cross-sectional views of the FinFET device according to some embodiments of the disclosure.
Figure 7A:
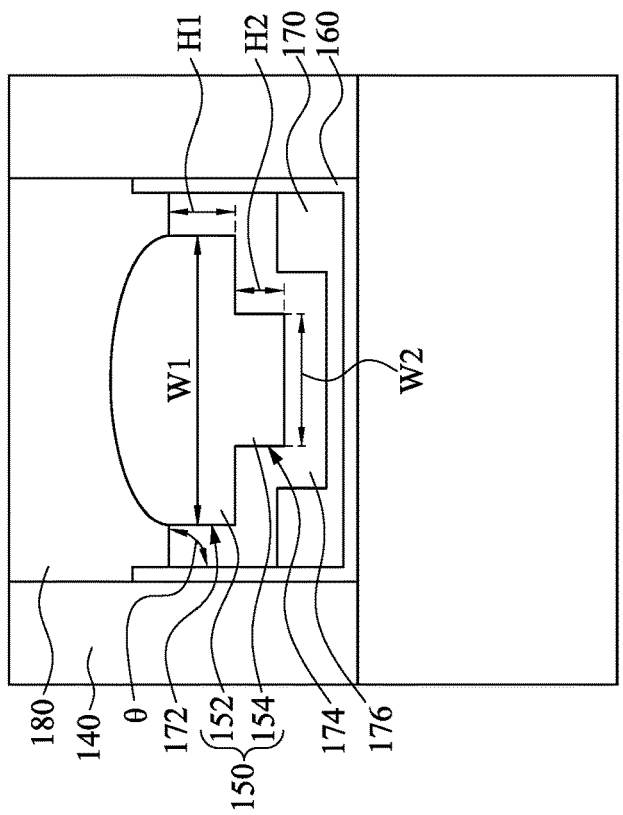

Referring to FIG. 7A and FIG. 7B, the FinFET device 100 of this embodiment is utilized in a NMOS device. The difference between this embodiment and FIGS. 6A and 6B is that the top surface of the work function metal layers is a flat plane surface, and the angle θ between the top surface of the work function metal layers 170, 172 and t0l degrees.

The trench with low aspect ratio is introduced and overlaps the trench with high aspect ratio for improving the metal filling ability when the gate electrode is formed. The unwanted voids cause by high aspect ratio can be prevented. Furthermore, the thickness of the work function metal layer(s) and/or the height of the gate electrode can be adjusted by the head portion, thus the threshold voltage of the FinFET device can be tuned accordingly.

According to some embodiments of the disclosure, a FinFET device includes a substrate, a fin formed on the substrate, and a gate electrode crossing the fin. The gate electrode includes a head portion and a tail portion, and the tail portion is connected to the head portion and extended toward the substrate. The width of the head portion is greater than that of the tail portion.

According to some other embodiments of the disclosure, a FinFET device includes a fin, a gate spacer having a first trench and crossing the fin, a work function metal layer formed in the first trench, and a gate electrode. The work function metal layer includes a second trench and a third trench, wherein the second trench is formed on the third trench, and an aspect ratio of the third trench is higher than that of the second trench. The gate electrode is filled into the second trench and the third trench.

According to some other embodiments of the disclosure method for fabricating a FinFET device, the method includes forming a fin on a substrate; forming a dielectric layer having a first trench on the fin; forming a work function metal layer in the first trench; forming a second trench in the work function layer; forming a third trench in the work function layer; and forming a gate electrode in the second trench and the third trench. The third trench is formed under the second trench, and an aspect ratio of the third trench is higher than that of the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a FinFET device, the method comprising:
   forming a fin on a substrate;
   forming a dielectric layer having a first trench on the fin;
   forming a first conductive layer in the first trench;
   forming a second trench in the first conductive layer;
   forming a third trench in the first conductive layer, wherein the third trench is formed under the second trench, an aspect ratio of the third trench being higher than an aspect ratio of the second trench; and
   forming a second conductive layer in the second trench and the third trench.

2. The method of claim 1, further comprising:
   removing a top portion of the first conductive layer and the second conductive layer.

3. The method of claim 2, wherein the removing is performed using a dry etching process.

4. The method of claim 2, further comprising:
   forming a cap layer on the first conductive layer and the second conductive layer.

5. The method of claim 2, wherein an upper surface of the second conductive layer has a convex shape.

6. The method of claim 1, wherein forming the first conductive layer comprises completely filling the first trench with the first conductive layer.

7. The method of claim 1, further comprising:
   after forming the second conductive layer, recessing the first conductive layer below an uppermost surface of the second conductive layer.

8. A method for fabricating a FinFET device, the method comprising:
   forming a fin on a substrate;
   forming isolation regions along opposing sides of the fin, the fin protruding above the isolation regions;
   forming a dielectric layer having a first trench on the fin and the isolation regions;
   filling the first trench with a first conductive layer in the first trench;
   removing a first portion of the first conductive layer to form a second trench in the first conductive layer;
   removing a second portion of the first conductive layer to form a third trench along a bottom of the second trench, a width of the third trench being less than a width of the second trench;
   forming a second conductive layer in the third trench and the second trench; and
   forming a third conductive layer in the second trench, wherein the second conductive layer contacts the first conductive layer and the third conductive layer.

9. The method of claim 8, wherein an aspect ratio of the third trench is higher than an aspect ratio of the second trench.

10. The method of claim 8, wherein an upper surface of the third conductive layer is convex.

11. The method of claim 8, wherein a height of the third conductive layer in the second trench is constant over the fin and over the isolation regions.

12. The method of claim 11, wherein a depth of the third trench is greater over the isolation regions than over the fin.

13. The method of claim 8, further comprising, after forming the second conductive layer, recessing the first conductive layer such that an upper surface of the first conductive layer is lower than an upper surface of the second conductive layer.

14. The method of claim 13, further comprising:
   prior to filling the first trench with the first conductive layer, forming a gate dielectric layer; and
   after forming the second conductive layer, recessing the gate dielectric layer such that an upper surface of the gate dielectric layer is lower than an upper surface of the second conductive layer.

15. A method for fabricating a FinFET device, the method comprising:
   forming a fin on a substrate;
   forming isolation regions along opposing sides of the fin, the fin protruding above the isolation regions;
   forming a dielectric layer having a first trench on the fin and the isolation regions;
   forming a first conductive layer in the first trench;
   removing a first portion of the first conductive layer to form a second trench in the first conductive layer;
   removing a second portion of the first conductive layer to form a third trench along a bottom of the second trench; and
   forming a second conductive layer in the third trench and the second trench.

16. The method of claim 15, further comprising, after forming the second conductive layer, recessing the first conductive layer below an uppermost surface of the dielectric layer.

17. The method of claim 16, further comprising forming a gate dielectric layer in the first trench prior to filling the first trench with the first conductive layer.

18. The method of claim 17, further comprising, after forming the second conductive layer, recessing the gate dielectric layer.

19. The method of claim 15, further comprising forming a cap layer over the second conductive layer, wherein an upper surface of the cap layer is level with an upper surface of the dielectric layer.

20. The method of claim 15, further comprising forming a third conductive layer in the second trench, wherein the third conductive layer is interposed between the first conductive layer and the second conductive layer, and wherein the second conductive layer physically contacts the first conductive layer in the third trench.

* * * * *